(12) United States Patent
Takeuchi et al.

(10) Patent No.: US 8,514,013 B2
(45) Date of Patent: Aug. 20, 2013

(54) INTEGRATED CIRCUIT DEVICE HAVING A PLURALITY OF INTEGRATED CIRCUIT CHIPS AND AN INTERPOSER

(75) Inventors: Ken Takeuchi, Tokyo (JP); Teruyoshi Hatanaka, Tokyo (JP); Koichi Ishida, Tokyo (JP); Tadashi Yasufuku, Tokyo (JP); Makoto Takamiya, Tokyo (JP); Takayasu Sakurai, Tokyo (JP)

(73) Assignee: The University of Tokyo, Tokyo (JP)

( * ) Notice: Subject to any disclaimer, the term of this patent is extended or adjusted under 35 U.S.C. 154(b) by 193 days.

(21) Appl. No.: 13/093,343

(22) Filed: Apr. 25, 2011

(65) Prior Publication Data

US 2011/0298534 A1    Dec. 8, 2011

(30) Foreign Application Priority Data

May 21, 2010    (JP) .................................. 2010-117652

(51) Int. Cl.
*H01L 25/00* (2006.01)
(52) U.S. Cl.
USPC .......................................... 327/566; 327/564

(58) Field of Classification Search
USPC .......................................... 327/564, 565, 566
See application file for complete search history.

(56) References Cited

U.S. PATENT DOCUMENTS 7,199,648 B2 *    4/2007   Horiguchi et al. ............ 327/544

OTHER PUBLICATIONS

Park et al., "A High Performance Controller for NAND Flash-based Solid State Disk (NSSD)," *IEEE Non-Volatile Semiconductor Memory Workshop*, Feb. 2006, pp. 17-20, IEEE.

* cited by examiner

*Primary Examiner* — Hai L Nguyen
(74) *Attorney, Agent, or Firm* — Oliff & Berridge, PLC (57) ABSTRACT

The channel number detecting circuit detects the operation channel number based on the output terminal voltage after falling down when the output terminal voltage falls down during the voltage boosting control, and the switching control circuit generates the control clock signal having the on-time and the off-time adjusted based on the operation channel number and performs the voltage boosting control using generating control clock signal. The voltage boosting control is properly performed based on the operation channel number when the operation channel number increase during performing the voltage boosting control. Thus boosting the power supply voltage up to a second voltage is accomplished.

13 Claims, 8 Drawing Sheets

| Nch | 1 | ..... | 15 | 16 | ..... | 24 |
|---|---|---|---|---|---|---|
| Ton/Toff | Ton1/Toff1 | ..... | Ton15/Toff15 | Ton16/Toff16 | ..... | Ton24/Toff24 |
| | Energy Saving Mode | | | High Speed Mode | | |

INTEGRATED CIRCUIT DEVICE HAVING A PLURALITY OF INTEGRATED CIRCUIT CHIPS AND AN INTERPOSER

BACKGROUND OF THE INVENTION

1. Field of the invention

The present invention relates to an integrated circuit device, for details, an integrated circuit device having a plurality of integrated circuit chips having an integrated circuit operated at a specified voltage; and an interposer.

2. Description of the Prior Art

A proposed structure of an integrated circuit device includes
a plurality of flash memory chips having a flash memory. In the proposed structure, the flash memory of the flash memory chips is divided into a plurality of banks and data are read and written from each bank by memory interleaving. Data are read and written in parallel from each flash memory chip (see, for example, Non-Patent Document 1). In this proposed integrated circuit device, this control successively performs high speed read/write operation.
Non-Patent Document 1: Chanik Park, Prakash Talawar, Daesik Won, MyungJin Jung, JungBeen Im, Suksan Kim and Youngjoon Choi, [A High Performance Controller for NAND Flash-based Solid State Disk (NSSD) ], IEEE Non-Volatile Semiconductor Memory Workshop, pp. 17-20, Feb. 2006

In this prior art integrated circuit device, the more flash memories to be read or written are, the larger power consumption is. Control reducing number of operating flash memory chips and making suppress of the consumption power take precedence over high speed transfer of data is generally performed. The number of the operating flash memory chips actually varies by the control. this prior art integrated circuit device, the flash memory regularly has a boost converter supplying high voltage for the write operating required for writing data in the flash memory chips. The boost converter does not boost the voltage properly when the number of the operating flash memory chips, that is, load of the boost converter varies while the boost converter boosts the voltage. For example, controlling a switching element of the boost converter by the signal that has the same on-time as before an increase in the number of the flash memory chips causes an increase in the time required for the voltage to reach the high voltage for write operation when the load of the boost converter is increased by the increase in the number of the operating flash memory chips while the boost converter boosts the voltage. Controlling the switching element of the boost converter by the signal that has the same on-time as before a decrease in the number of the flash memory chips causes earlier output of the high voltage for the write operation than necessary and wastes electric power when the load of the boost converter is decreased by the decrease in the number of the operation flash memory chips while the boost converter boosts the voltage. So it is desired to boost the voltage properly in response to increase and decrease in the number of the operation chips.

SUMMARY OF THE INVENTION

In an integrated circuit device, there would thus be a demand for boosting a voltage supplied from a power supply up to a specified voltage in response to number of chips operated by a voltage supplied from a voltage boosting circuit.

The present invention accomplishes at least part of the demand mentioned above and the other relevant demands by the following configurations applied to the integrated circuit device.

According to one aspect, the present invention is directed to an integrated circuit device having: a plurality of integrated. circuit chips having an integrated circuit operated at a specified voltage; and an interposer. In the integrated circuit device, the interposer has; a voltage boosting supply circuit that boosts a power-supply voltage supplied from a power supply to the specified voltage and supplies the boosting voltage to the integrated circuit of the integrated circuit chips; and a chip control circuit that selects at least one of the plurality of integrated circuit chips and controls the integrated circuit so that the selecting integrated circuit chip is operated using the supplied voltage from the voltage boosting supply circuit. The chip control circuit changes number of the selecting integrated circuit chips based on a specified control signal. The voltage boosting supply circuit has: a boost converter having an inductor connected in series between an input terminal supplied with the power supply voltage and an output terminal supplying a voltage to the integrated circuit of the integrated circuit chip, a rectifying element connected in series between the inductor and the output terminal and rectifying current to a direction from the input terminal to the output terminal, and a switching element connected between the inductor and the rectifying element in parallel with the output terminal as viewed from the inductor; a number-of-chip detecting circuit detecting number of operating integrated circuit chips that is number of the integrated circuit chips operating at a voltage supplied from the voltage boosting supply circuit based on a voltage of the output terminal of the boost converter after reduction when the voltage of the output terminal of the boost converter is reduced during being performed a voltage boosting switching control that controls the switching element so that the output terminal voltage reaches the specified voltage; and a switching control circuit generating a control clock signal having turn-on time and turn-off time adjusted based on the detected number of operating integrated circuit chips and performing the voltage boosting switching control using the generated control clock signal.

In the integrated circuit device according to this aspect of the invention, the number-of-chip detecting circuit detects number of operating integrated circuit chips that is number of the integrated circuit chips operating at the voltage supplied from the voltage boosting supply circuit based on the voltage of the output terminal of the boost converter after reduction when the voltage of the output terminal of the boost converter is reduced during being performed the voltage boosting switching control that controls the switching element so that the output terminal voltage reaches the specified voltage. The switching control circuit generates control clock signal having turn-on time and turn-off time adjusted based on the detected number of operating integrated circuit chips and performs the voltage boosting switching control using the generated control clock signal. This arrangement properly detects the number of the operation chips. Thus boosting the voltage supplied from the power supply up to the specified voltage is accomplished.

In one preferable application of the integrated circuit device according to the above aspect of the invention, the chip control circuit changes the number of selecting integrated circuit chips from a first number of chips to a second number of chips based on the specified control signal. The second number is greater than the first number. The number-of-chip detecting circuit of the voltage boosting supply circuit detects the number of the operation chips as the second number of chips when the voltage of the output terminal varies from a voltage higher than or equal to a first determination reference voltage to a voltage lower than a second determination reference voltage during performing of the voltage boosting switching control. The second determination reference voltage is lower than the first determination reference and a voltage for determining whether the number of the operation chips varies from the first number of chips to the second number of chips or not. This arrangement properly detects the number of the operation chips. Thus boosting the voltage supplied from the power supply up to the specified voltage is accomplished.

In another preferable application of the integrated circuit device according to the above aspect of the invention, the number-of-chip detecting circuit of the voltage boosting supply circuit has: an increase side reference voltage generation-output circuit generating and outputting the first determination reference voltage and the second determination reference voltage, the first determination reference voltage and the second determination reference voltage tending to be higher as the output terminal voltage becomes higher; and an increase side detecting circuit detecting the number of the operation chips as the second number of chips when the voltage of the output terminal varies from a voltage higher than or equal to the first determination reference voltage to a voltage lower than the second determination reference voltage during performing of the voltage boosting switching control. Owing to change of the voltage of the output terminal during the voltage boosting switching control, detecting the number of the operation chips is not performed properly when the first determination reference voltage and the second determination reference voltage are maintained regardless of the voltage of the output terminal. The increase side reference voltage generation-output circuit generates and outputs the first determination reference voltage and the second determination reference voltage tending to be higher as the output terminal voltage becomes higher, and the increase side detecting circuit detects the number of the operation chips using the first reference voltage and the second reference voltage. This arrangement properly detects the number of the operation chips. Thus boosting the voltage supplied from the power supply up to the specified voltage is accomplished.

In one preferable application of the integrated circuit device according to the above aspect of the invention, the chip control circuit changes the number of selecting integrated circuit chips from the first number of chips to the second number of chips or from the first number of chips to a third number of chips that is greater than the second number of chips based on the specified control signal, and the number-of-chip detecting circuit of the voltage boosting supply circuit detects the number of the operation chips as the second number of chips when the voltage of the output terminal varies from a voltage higher than or equal to the first determination reference voltage to a voltage lower than the second determination reference voltage and higher than or equal to the third determination reference voltage during performing of the voltage boosting switching control, and detects the number of the operation chips as the third number of chips when the voltage of the output terminal varies from a voltage being higher than or equal to the first determination reference voltage to a voltage being lower than the third second determination reference voltage during performing of the voltage boosting switching control. This arrangement properly detects the number of the operation chips even when the chip control circuit changes the number of selecting integrated circuit chips from the first number of chips to the second number of chips or from the first number of chips to a third number of chips. Thus boosting the voltage supplied from the power supply up to the specified voltage is accomplished.

In another preferable application of the integrated circuit device according to the above aspect of the invention, the number-of-chip detecting circuit of the voltage boosting supply circuit detects the number of the operation chips based on a voltage after increase when the voltage of the output terminal increases to be a voltage higher than or equal to a specified voltage within a specified period during performing of the voltage boosting switching control. This arrangement properly detects the number of the operation chips. Thus boosting the voltage supplied from the power supply up to the specified voltage is accomplished.

In the integrated circuit device according to this aspect of the invention and detecting the number of the operation chips based on a voltage after increase when the voltage of the output terminal increases to be a voltage higher than or equal to a specified voltage, the chip control circuit changes the number of selecting integrated circuit chips from a fourth number of chips to a fifth number of chips that is greater than the fourth number of chips based on the specified control signal, and the number-of-chip detecting circuit of the voltage boosting supply circuit detects the number of the operation chips as the fifth number of chips when the voltage of the output terminal reaches to a voltage higher than or equal to the third determination reference voltage and exceeds a fourth determination reference voltage within the specified time after the voltage of the output terminal becomes higher than or equal to the third determination reference voltage during performing of the voltage boosting switch control, the fourth determination reference voltage being a voltage for determining a condition that the number of the operation chips is changed from the fourth number of the chips to the fifth number of chips and being higher than the third determination reference voltage. This arrangement properly detects the number of the operation chips. Thus boosting the voltage supplied from the power supply up to the specified voltage is accomplished.

In the integrated circuit device according to this aspect of the invention and detecting the number of the operation chips based on a voltage after increase when the voltage of the output terminal increases to be a voltage higher than or equal to a specified voltage, the number-of-chip detecting circuit of the voltage boosting supply circuit has: a decrease side reference voltage generation-output circuit generating and outputting the third determination reference voltage and the fourth determination reference voltage, the third determination reference voltage and the fourth determination reference voltage tending to be higher as the output terminal voltage becomes higher; and a decrease side detecting circuit detecting the number of the operation chips as the fifth number of chips when the voltage of the output terminal reaches to a voltage higher than or equal to the third determination reference voltage and exceeds the fourth determination reference voltage within the specified time after the voltage of the output terminal becomes higher than or equal to the third determination reference voltage during performing of the voltage boosting switch control. Owing to change of the voltage of the output terminal during the voltage boosting switching control, detecting the number of the operation chips is not performed properly when the third determination reference voltage and the fourth determination reference voltage are maintained regardless of the voltage of the output terminal. The decrease side reference voltage generation-output circuit generates and outputs the third determination reference voltage and the fourth determination reference voltage tending to be higher as the output terminal voltage becomes higher, and the decrease side detecting circuit detects the number of the operation chips using the first reference voltage and the second reference voltage. This arrangement properly detects the number of the operation chips. Thus boosting the voltage supplied from the power supply up to the specified voltage is accomplished.

In the integrated circuit device according to this aspect of the invention and detecting the number of the operation chips based on a voltage after increase when the voltage of the output terminal increases to be a voltage higher than or equal to a specified voltage, the chip control circuit changes the number of selecting integrated circuit chips from the forth number of chips to the fifth number of the chips or from the forth number of chips to a sixth number of the chips that is less than the fifth number of chips based on the specified control signal, and the number-of-chip detecting circuit of the voltage boosting supply circuit detects the number of the operation chips as the fifth number of chips when the voltage of the output terminal reaches to a voltage higher than or equal to the third determination reference voltage and the voltage of the output terminal becomes lower than or equal to a fifth determination reference voltage within a second specified time after the voltage of the output terminal becomes higher than or equal to the third determination reference voltage during performing of the voltage boosting switch control, and detects the number of the operation chips as the sixth number of chips when the voltage of the output terminal reaches to a voltage higher than or equal to the third determination reference voltage and the voltage of the output terminal becomes higher than the fifth determination reference voltage within a third specified time after the voltage of the output terminal becomes higher than or equal to the third determination reference voltage during performing of the voltage boosting switch control, the fifth determination reference voltage being higher than the fourth determination reference voltage. This arrangement properly detects the number of the operation chips even when the chip control circuit changes the number of selecting integrated circuit chips from the fourth number of chips to the fifth number of chips or from the fourth number of chips to the sixth number of chips. Thus boosting the voltage supplied from the power supply up to the specified voltage is accomplished.

According to another aspect, the present invention is directed to an integrated circuit device having: a plurality of integrated circuit chips having an integrated circuit operated at a specified voltage; and an interposer. In the integrated circuit device, the interposer has; a voltage boosting supply circuit that boosts a power-supply voltage supplied from a power supply to the specified voltage and supplies the boosting voltage to the integrated circuit of the integrated circuit chips; and a chip control circuit that selects at least one of the plurality of integrated circuit chips and controls the integrated circuit so that the selecting integrated circuit chip is operated using the supplied voltage from the voltage boosting supply circuit, the chip control circuit changes number of the selecting integrated circuit chips based on a specified control signal, and the voltage boosting supply circuit has: a boost converter having a inductor connected in series between an input terminal supplied with the power supply voltage and an output terminal supplying a voltage to the integrated circuit of the integrated circuit chip, a rectifying element connected in series between the inductor and the output terminal and rectifying current to a direction from the input terminal to the output terminal, and a switching element connected between the inductor and the rectifying element in parallel with the output terminal as viewed from the inductor; a number-of-chip detecting circuit detecting number of operating integrated circuit chips that is number of the integrated circuit chips operating at a voltage supplied from the voltage boosting supply circuit based on a voltage of the output terminal of the boost converter after rising when an output terminal voltage that is the voltage of the output terminal of the boost converter rises during being performed a voltage boosting switching control controlling the switching element so that the output terminal voltage reaches the specified voltage; and a switching control circuit generating a control clock signal having turn-on time and turn-off time adjusted based on the detected number of operating integrated circuit chips and performing the voltage boosting switching control using the generated control clock signal.

In the integrated circuit device according to this aspect of the invention, the number-of-chip detecting circuit detects the number of operating integrated circuit chips that is number of the integrated circuit chips operating at a voltage supplied from the voltage boosting supply circuit based on a voltage of the output terminal of the boost converter after rising when the output terminal voltage that is the voltage of the output terminal of the boost converter rises during being performed the voltage boosting switching control controlling the switching element so that the output terminal voltage reaches the specified voltage. The switching control circuit generates the control clock signal having turn-on time and turn-off time adjusted based on the detected number of operating integrated circuit chips and performing the voltage boosting switching control using the generated control clock signal. The voltage boosting switching control is performed properly based on the number of the operating chips. Thus boosting a voltage supplied from the power supply up to the specified voltage is accomplished.

In one preferable application of the integrated circuit device according to the above aspect of the invention, the switch control circuit generates the control clock signal having turn-on time and turn-off time adjusted in a manner that makes reduction in power consumption accompanying the voltage boosting switching control take precedence over rapid rising of the output terminal voltage when the detected number of the operation chips is lower than or equal to a specified number, and generates the control clock signal having turn-on time and turn-off time adjusted in a manner that makes the rapid rising of the output terminal voltage take precedence over the reduction in power consumption accompanying the voltage boosting switching control when the detected number of the operation chips is higher than the specified number. Making the reduction in power consumption accompanying the voltage boosting switching control take precedence over rapid rising of the output terminal voltage is performed when the detected number of the operation chips is lower than or equal to a specified number. Thus boosting a voltage supplied from the power supply up to the specified voltage is accomplished when the detected number of the operation chips is lower than or equal to a specified number. Making the rapid rising of the output terminal voltage take precedence over the reduction in power consumption accompanying the voltage boosting switching control is also performed when the detected number of the operation chips is higher than the specified number. Thus boosting a voltage supplied from the power supply up to the specified voltage is accomplished when the detected number of the operation chips is higher than the specified number.

In another preferable application of the integrated circuit device according to the above aspect of the invention, the integrated circuit is a flash memory.

DESCRIPTION OF THE PREFERRED EMBODIMENTS

One mode of carrying out the invention is described below as a preferred embodiment.

Figure 1:
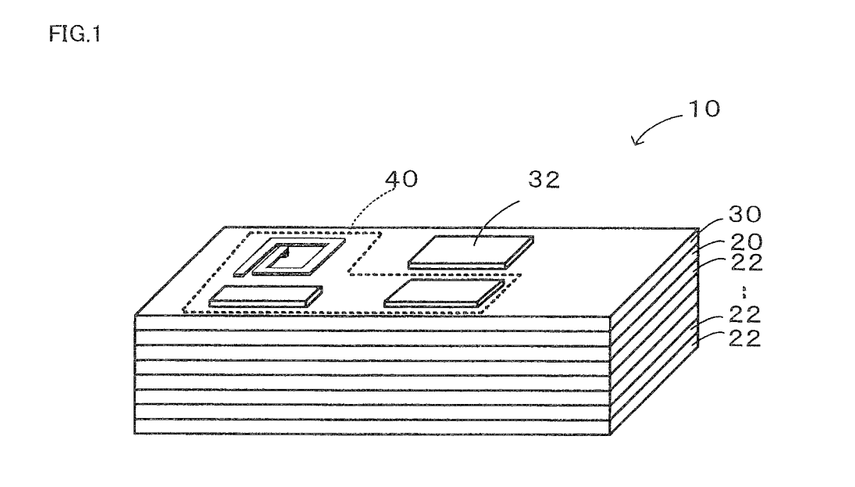
FIG. 1 schematically illustrates the configuration of a SSD (Solid State Disk) 10 of one embodiment of the invention.

FIG. 1 schematically illustrates the configuration of a SSD (Solid State Disk) 10 equipped with as an internal storage of a computer of one embodiment of the invention. The SSD 10 has a DRAM (Dynamic Random Access Memory) chip 20 that is a silicon chip formed DRAM, a plurality of a flash memory chip 22 that is a silicon chip formed NAND-type flash memory, and an interposer 30 disposed on an upper surface. The SSD 10 is supplied a voltage V1 (for example, 1.6V, 1.8V, 2.0V etc.) as a power-supply voltage from an external power supply not illustrated. In this embodiment, DRAM chip 20 is operated at the voltage V1. A program-voltage for writing of the NAND-type flash memory is the voltage V1 and a readout voltage of the NAND type flash memory is a voltage V2 (for example, 18V, 20V, 22V etc.). Through holes (not illustrated) are formed in the. DRAM chip 20 and the flash memory chip 22 and pierce from a top surface of the chip to a back surface of the chips. The DRAM chip 20 is connected electrically with the flash memory chip 22 via a connecting wire formed by filling into the through hole with a metallic material with higher conductive material (for example, copper etc.). In this embodiment, the 24 flash memory chips 22 is stacked. The number of the flash memory chips 22 is to be no restrictive. The number of the flash memory chips 22 may be more than or equal to 2 chips.

Figure 2:
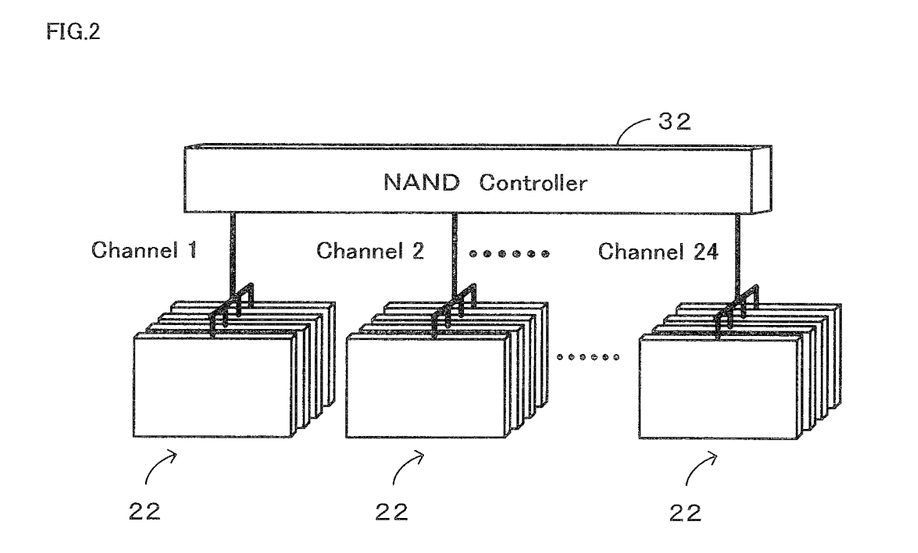
FIG. 2 schematically illustrates the configuration of a NAND controller 32 and 24 flash memory chips 22.

The interposer 30 has a NAND controller 32 controlling the flash memory that the flash memory chip 22 is equipped with, a voltage boosting circuit 40 boosting the voltage V1 supplied from the power-supply to the voltage V2 to supply the boosted voltage to the flash memory of the flash memory chip 22, a connecting wire (not illustrated) from the voltage boosting circuit 40 or from the NAND controller 32 and so on. The NAND controller 32, illustrated in FIG. 2, is configured to exchange data with the 24 memory chips 22 via cannels 24. The NAND controller 32 selects at least one of the 24 flash memory chips based on a control signal from CPU (not illustrated) of the computer and controls the flash memory equipped with the flash memory chips 22 so that the selecting flash memory chip 22 is operated using the supplied voltage from the voltage boosting circuit 40. The number of the selecting flash memory chips Nch (described below as an operation channel number) varies in response to the control signal accordingly.

Figure 3:
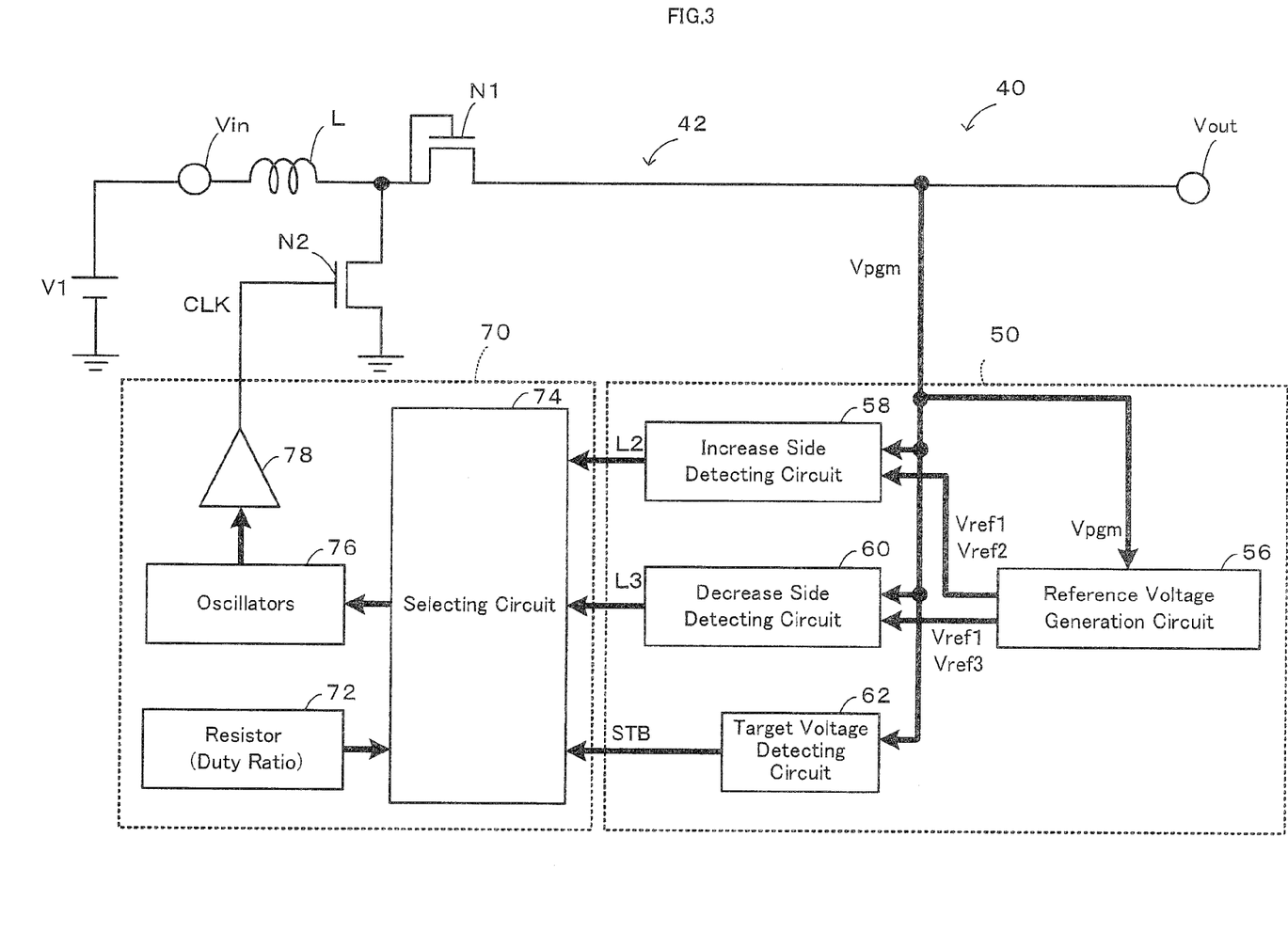
FIG. 3 schematically illustrates the circuit of a boost converter 40 equipped with an interposer 30.

FIG. 3 schematically illustrates the configuration of the voltage boosting circuit 40 that the interposer 30 is equipped with. The voltage boosting circuit 40 has a boost converter 42 boosting a voltage V1 supplied from an input terminal Vin and outputting a boosted voltage to the flash memory from an output terminal Vout, a number-of-chip detecting circuit 50 detecting the operation channel number Nch using a voltage from the output terminal Vout, and a switching control circuit 70 performing a voltage boosting switching control controlling the boost converter 42 using a control clock signal CLK so that an output terminal voltage Vpgm that is a voltage of the output terminal Vout of the boost converter 42 reaches to the voltage V2. The control clock signal CLK has turn-on time and turn-off time adjusted based on the detected operation channel number Nch that is detected by the number-of-chip detecting circuit 50.

The boost converter 42 has an inductor L connected in series between the input terminal Vin and the output terminal Vout, an enhancement-type NMOS (N-channel Metal Oxide Semiconductor) transistor N1 (described below as a transistor N1) having a gate, a source connected with the gate and connected with the inductor L and a drain connected with the output terminal Vout, and a depletion-type NMOS transistor N2 (described below as a transistor N2) connected in parallel with the output terminal Vout between the inductor L and the transistor N1 from a side of the inductor L. The switching of the transistor N2 is controlled by the clock signal CLK output from the switching control circuit 70.

The number-of-channel detecting circuit 50 has a reference voltage generation-output circuit 56 generating determination reference voltages Vref1, Vref2 and Vref3 for determination of increase or decrease of the output terminal Vpgm using the output terminal voltage Vpgm and a power-supply voltage Vdd (the voltage V1 in this embodiment) supplied from the outside circuit, a increase side detecting circuit 58 detecting the operation channel number Nch after increase when the operation channel number Nch increases during being performed the voltage boosting control by the switching control circuit 70, a decrease side detecting circuit 60 detecting the operation channel number Nch after decrease when the operation channel number Nch decreases during being performed the voltage boosting control by the switching control circuit 70, and a target voltage detecting circuit 62 outputting a standby signal STB when the output terminal voltage Vpgm reaches the voltage V2.

Figure 4:
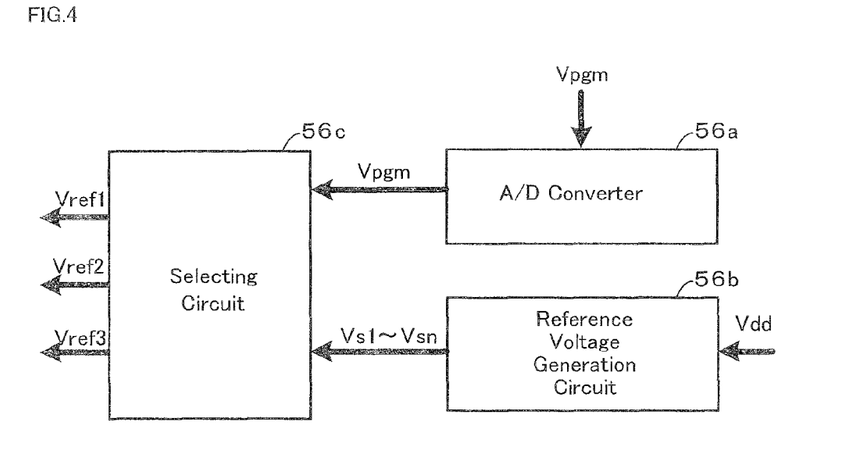
FIG. 4 schematically illustrates the circuit of a reference voltage generation circuit 56.

The reference voltage generation-output circuit 56 has an A/D converter 56a converting the output terminal voltage Vpgm to a digital value to output the converted digital value, and a reference voltage generation circuit 56b generating a plurality of reference voltages Vs1~Vsn (n is integer more than or equal to 2) from the power supply Vdd. The reference voltage generation-output circuit 56 also has a selecting circuit 56c being input the output terminal voltage Vpgm from the A/D converter 56a and the reference voltages Vs1~Vsn from the reference voltage generation circuit 56b. The selecting circuit 56c selects reference voltages Vref1, Vref2 and Vref3 for determination of increase or decrease of the output terminal voltage Vpgm from the reference voltages Vs1~Vsn based on the output terminal voltage Vpgm. The selecting circuit 56c stores a previous-cycle output terminal voltage Vpre that is the output terminal voltage when the transistor N2 is turn-on by the control clock signal CLK in a previous cycle. The selecting circuit 56c selects a voltage that is slightly higher than a previous-cycle output terminal voltage Vpre of the reference voltages Vs1~Vsn as a determination reference voltage Vref1, and outputs the determination reference voltage Vref1. The determination reference voltage Vref1, that is, is a threshold voltage whether the output voltage Vpgm increases or not. The selecting circuit 56c stores an increase pattern Pitag (for example, the operation channel number is increased from 1 to 4 etc.) that is an increase pattern of the operation channel number Nch to be detected preliminarily. The selecting circuit 56c also stored a decrease pattern Pdtag (for example, the operation channel number is increased from 4 to 1 etc.) that is a decrease pattern of the operation channel number Nch to be detected preliminarily. The selecting circuit 56c selects a voltage that is slightly higher than a voltage V1 and higher as the output terminal voltage Vpgm is higher of the reference voltages Vs1~Vsn as a determination reference voltage Vref2. The voltage. V1 is a minimum voltage of the output terminal Vpgm when the operation channel number Nch increases in set-up increase pattern Pitag.

The selecting circuit 56c selects a voltage that is slightly lower than a voltage Vh as a determination reference voltage Vref3. The voltage Vh is a maximum voltage of the output terminal Vpgm when the operation channel number Nch decreases in set-up decrease pattern Pdtag and the output terminal voltage Vpgm and the output terminal voltage Vpgm increases. Thus the reference voltage generation circuit 56b is configured to output a voltage that is supposed to be used as determination reference voltage Vref1~Vref3. The reason for output of determination voltages Vref2 and Vref3 from the selecting circuit 56c is explained next.

Figure 5:
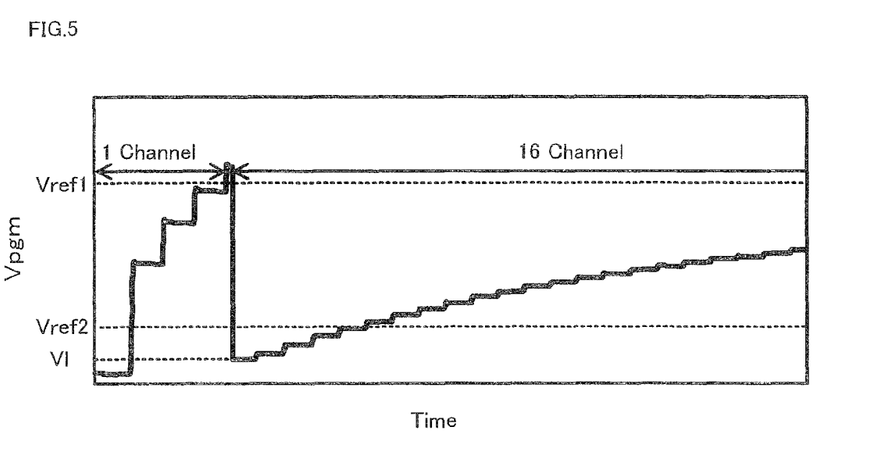
FIG. 5 schematically illustrates time variation of an output terminal voltage Vpgm when number of operation channels Nch increased from 1 channel to 16 channels.

FIG. 5 schematically illustrates time variation of the output terminal voltage Vpgm when number of operation channels Nch increased from 1 channel to 16 channels. The output terminal voltage Vpgm rises in the shape of steps toward the voltage V2 by the voltage boosting switching control performed by the switching control circuit 70 when the operation channel number Nch is maintained. A load capacitance connected to the output terminal Vout of the boost converter 42 increases when the operation channel number Nch increases during performing the voltage boosting switching control. The output terminal voltage Vpgm falls down to the voltage V1 as shown by a diagram. The voltage V1 is set by the output terminal Vpgm and the increase pattern Pitag of the operation channel Nch. The more the operation channel Nch after increase is, the larger the load capacitance of the output terminal Vout of the boost converter 42 is and the lower the voltage V1 is. The higher the output terminal voltage Vpgm before drop is, the higher the voltage V1 is. The determination reference voltage Vref2 is output as a voltage that is slightly higher than the voltage V1 and is higher as the output terminal voltage Vpgm is higher. The output terminal voltage Vpgm is compared with the determination voltage Vref2. Thus whether or not the operation channel number Nch increases in the preliminarily set increase pattern Pitag is determined. The determination reference voltage Vref2 is generated as a threshold for such a determination.

Figure 6:
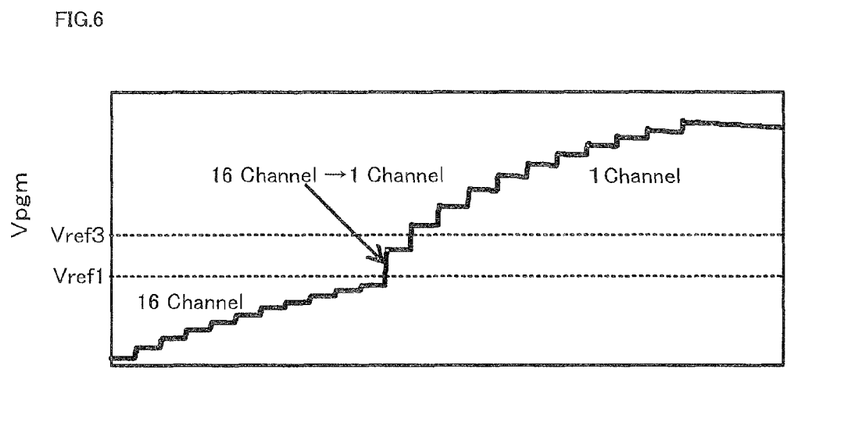
FIG. 6 schematically illustrates the time variation of the output terminal voltage Vpgm when the number of the operation channels decreased from 16 channels to 1 channel.
Figure 7:
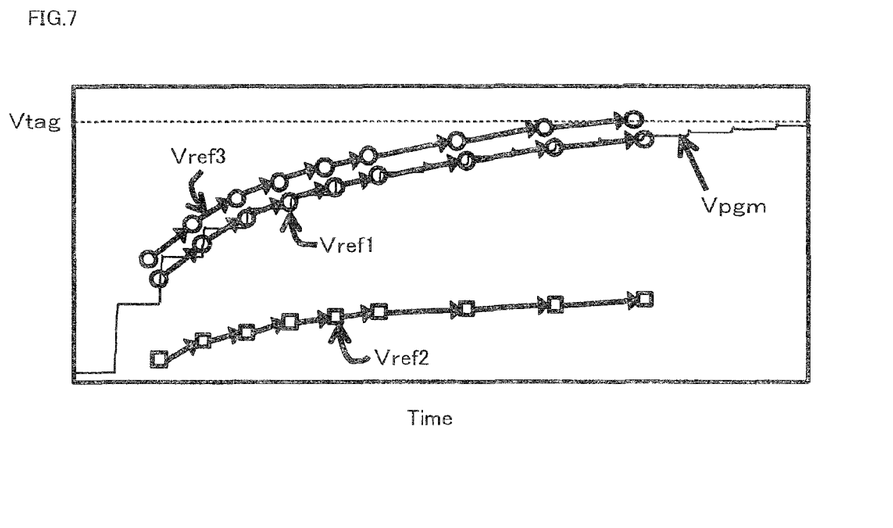
FIG. 7 schematically illustrates time variation of determination voltages Vref1, Vref2, Vre3.

FIG. 6 schematically illustrates the time variation of the output terminal voltage Vpgm when the number of the operation channels decreased from 16 channels to 1 channel. As shown by a diagram, the output terminal voltage Vpgm rises to the voltage Vh that exceeds amount of an increase in voltage by the voltage boosting switching control when the operation channel number Nch decrease and the load capacitance of the output terminal Vout of the boost converter 42. The less the operation channel Nch after decrease is, the lower the load capacitance of the output terminal Vout of the boost converter 42 is and the higher the voltage Vh is. The higher the output terminal voltage Vpgm before rising is, the higher the voltage Vh is. The determination reference voltage Vref3 is output as a voltage that is slightly higher than the voltage Vlh and is higher as the output terminal voltage Vpgm is higher. The output terminal voltage Vpgm is compared with the determination voltage Vref3. Thus whether or not the operation channel number Nch decreases in the preliminarily set decrease pattern Pdtag is determined. The determination reference voltage Vref3 is generated as a threshold for such a determination. FIG. 7 schematically illustrates time variation of the determination voltages Vref1, Vref2, Vre3.

Figure 8:
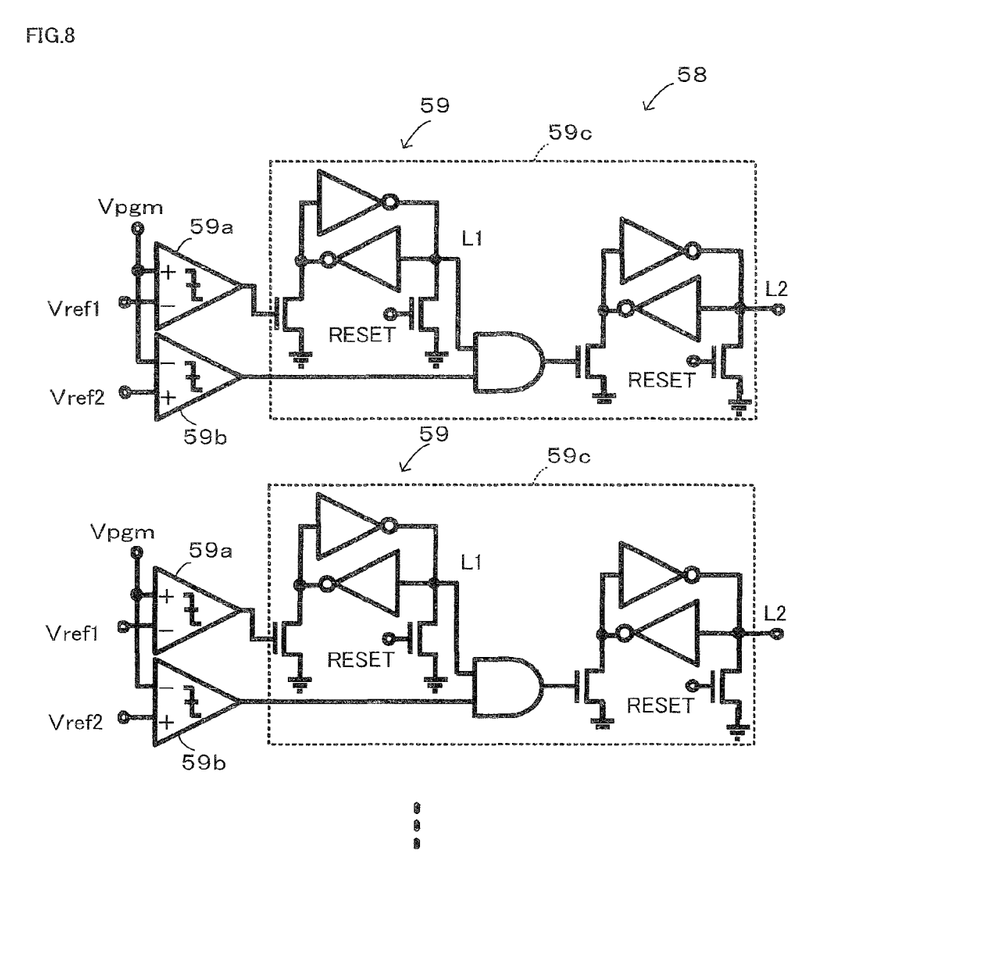
FIG. 8 schematically illustrates the circuit of an increase side detecting circuit 58.

The increase side detecting circuit 58, illustrated in FIG. 8, has a plurality of detecting circuit 59. The detecting circuit 59 has a comparator 59a, a comparator 59b, and a logic circuit 59c. The comparator 59a compares the output terminal voltage Vpgm with the determination reference voltage Vref1, outputs a logic signal with low voltage (described below as a low level signal) when the output terminal voltage Vpgm is lower than the determination reference voltage Vref1, and outputs a logic signal with high voltage (described below as a high level signal) when the output terminal voltage Vpgm is higher than or equal to the determination reference voltage Vref1. The comparator 59b compares the output terminal voltage Vpgm with the determination reference voltage Vref2, outputs a low level signal when the output terminal voltage Vpgm is higher than or equal to the determination reference voltage Vref2, and outputs a high level signal when the output terminal voltage Vpgm is lower than the determination reference voltage Vref2. The logic circuit 59c is input a reset signal that is an antiphase signal to the control clock signal and signals the comparator 59a and 59b, outputs a low level signal from a terminal L2 when anyone of the reset signal, a signal from comparators 59a and 59b is a low level signal, and outputs a high level signal from the terminal L2 when high level signals is input from the comparators 59a and 59b with the reset signal being low level signal. The detecting circuit 59 is supplied with the determination reference signals Vref1 and Vref2 in the increase pattern Pitag of the operation channel number to be detected, and outputs a high level signal from the terminal L2 while the reset signal is a low level signal, that is, when the output terminal voltage Vpgm becomes lower than the determination reference voltage Vref2 after the output terminal voltage Vpgm becomes higher than or equal to the determination reference voltage Vref1 with the control clock signal CLK being a high level signal. The determination reference voltage Vref1 is a threshold for a determination whether the output terminal voltage Vpgm is boosted or not. The determination reference voltage Vref2 is a threshold for a determination whether the operation channel number Nch increase in the preliminarily set increase pattern Pitag or not. The operation channel number Nch is to increase in the increase pattern Pitag when the high level signal is output from the terminal L2. Thus detection of the increase pattern Pitag of the operation channel Nch by the detecting circuit 59 is accomplished.

One detecting circuit 59 detects one the increase pattern Pitag. Number of the detecting circuit 59 included the increase side detecting circuit 58 is configured to the same number as that of the all assumed increase pattern Pitag. For example, for detecting increase of the number of the operation channel Nch from one channel to two channels, from one channel to three channels, or from one channel to four channels, three channels, or four channels, the increase side detecting circuit 58 is configured to three detecting circuits 59. One detecting circuit 59 is for detecting the increase of the number of the operation channel Nch from one channel to two channels, one detecting circuit 59 is for detecting the increase of the number of the operation channel Nch from one channel to three channels, and one detecting circuit 59 is for detecting the increase of the number of the operation channel Nch from one channel to four channels. Tree detecting circuit 59 are supplied the determination reference voltage Vref1 at the time when the operation channel number Nch is equal to one. One detecting circuit 59 is supplied the determination reference voltages Vref2 at the time when the operation channel number Nch increases from one to two, one detecting circuit 59 is supplied the determination reference voltages Vref2 at the time when the operation channel number Nch increases from one to four, and one detecting circuit 59 is supplied the determination reference voltages Vref2 at the time when the operation channel number Nch increases from one to four. When the operation channel number Nch increases from one to two, only terminal L2 of the detecting circuit 59 supplied the determination reference voltage Vref2 at the time when the operation channel number Nch increases from one to two outputs a high level signal. When the operation channel number Nch increases from one to four, three terminals L2 of the three detecting circuits 59 supplied the three determination reference voltage Vref2, that is, the detecting circuit 59 supplied the determination reference voltage Vref2 at the time when the operational channel number Nch increase from one to two, the detecting circuit 59 supplied the determination reference voltage Vref2 at the time when the operational channel number Nch increases from one to three, and the detecting circuit 59 supplied the determination reference voltage Vref2 at the time when the operational channel number Nch increase from one to four. When a plurality of the terminals L2 output high level signal, the increase pattern Pitag that is the largest increase amount of the operation number Nch is detected as actual increase pattern. Thus detecting of the increase pattern, that is, the operation channel Nch after increase is accomplished.

Figure 9:
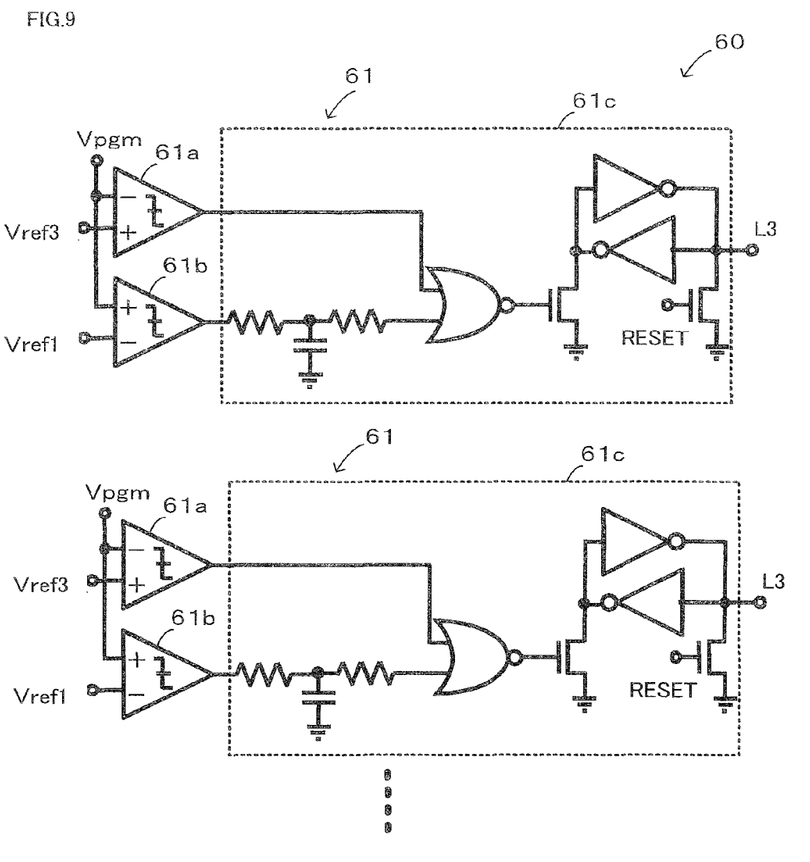
FIG. 9 schematically illustrates the circuit of a decrease side detecting circuit 60.

The decrease side detecting circuit 60, illustrated in FIG. 9, has a plurality of detecting circuit 61. The detecting circuit 61 has a comparator 61a, a comparator 61b, and a logic circuit 61c. The comparator 61a compares the output terminal voltage Vpgm with the determination reference voltage Vref3, outputs a high level signal when the output terminal voltage Vpgm is lower than the determination reference voltage Vref3, and outputs a logic signal with a low level signal when the output terminal voltage Vpgm is higher than or equal to the determination reference voltage Vref3. The comparator 61b compares the output terminal voltage Vpgm with the determination reference voltage Vref1, outputs a high level signal when the output terminal voltage Vpgm is lower than the determination reference voltage Vref1, and outputs a low level signal when the output terminal voltage Vpgm is higher than and equal to the determination reference voltage Vref1. The logic circuit 61c is outputs a low level signal from a terminal L3 when any one of the reset signal that is antiphase to the control clock signal, a signal obtained by delaying a output signal from comparators 61a for 2 cycles time of the control clock signal CLK, and a signal obtained by delaying a output signal from comparators 61b for 2 cycles time of the control clock signal CLK. The detecting circuit 61 is supplied with the determination reference signals Vref1 and Vref3 in the decrease pattern Pdtag of the operation channel number Nch to be detected, and outputs a high level signal from the terminal L3 with the timing when the reset signal becomes a low level signal, that is, the control clock signal becomes a high level signal when the output terminal voltage Vpgm exceeds the determination reference signals Vref1 and Vref3 within the 2 cycles time of the control clock signal. The reason why excess the determination reference signals Vref1 and Vref3 of the output terminal voltage Vpgm within the 2 cycles time of the control clock signal is considered is described below. The output terminal voltage Vpgm rises by the voltage boosting control even when the operation channel number Nch is maintained. The rising of the output terminal voltage Vpgm during maintaining the operation channel number Nch is discriminated from the rising of the output terminal voltage Vpgm during decreasing the operation channel number Nch. The determination reference voltage Vref1 is a threshold for a determination whether the output terminal voltage Vpgm is boosted or not. The determination reference voltage Vref3 is a threshold for a determination whether the operation channel number Nch decrease in the preliminarily set decrease pattern Pdtag or not. The operation channel number Nch is to decrease in the decrease pattern Pdtag when the high level signal is output from the terminal L3. Thus detection of the decrease pattern Pdtag of the operation channel Nch by the detecting circuit 61 is accomplished.

One detecting circuit 61 detects one the decrease pattern Pdtag. Number of the detecting circuit 61 included the increase side detecting circuit 60 is configured to the same number as that of the all assumed increase pattern Pdtag. For example, for detecting decrease of the number of the operation channel Nch from four channels to three channels, from four channels to two channels, or from four channels to one channel, the decrease side detecting circuit 60 is configured to three detecting circuits 61. One detecting circuit 61 is for detecting the increase of the number of the operation channel Nch from four channel to three channels, one detecting circuit 61 is for detecting the increase of the number of the operation channel Nch from four channels to two channels, and one detecting circuit 61 is for detecting the increase of the number of the operation channel Nch from four channels to one channels. Tree detecting circuit 61 are supplied the determination reference voltage Vref1 at the time when the operation channel number Nch is equal to four. One detecting circuit 61 are supplied the determination reference voltages Vref3 at the time when the operation channel number Nch decreases from four to three, one detecting circuit 61 is supplied the determination reference voltages Vref3 at the time when the operation channel number Nch decreases from four to two, one detecting circuit 61 is supplied the determination reference voltages Vref3 at the time when the operation channel number Nch decreases from four to one. When the operation channel number Nch decreases from four to three, only terminal L3 of the detecting circuit 61 supplied the determination reference voltage Vref3 at the time when the operation channel number Nch decreases from four to three outputs a high level signal. When the operation channel number Nch decreases from four to one, three terminals L2 of the three detecting circuits 61 supplied the three determination reference voltage Vref3, that is, the detecting circuit 61 supplied the determination reference voltage Vref3 at the time when the operational channel number Nch decrease from four to three, the detecting circuit 61 supplied the determination reference voltage Vref3 at the time when the operational channel number Nch decrease from four to two, and the detecting circuit 61 supplied the determination reference voltage Vref3 at the time when the operational channel number Nch decrease from four to one. When a plurality of the terminals L3 output high level signal, the decrease pattern Pdtag that is the largest decrease amount of the operation number Nch is detected as actual decrease pattern. Thus detecting of the decrease pattern, that is, the operation channel Nch after decrease is accomplished.

The switching control circuit 70 has a resistor 72 stored turn-on time Ton and turn-off time Toff of each operation channels Nch as an on-off-time setting table, a selecting circuit 74 selecting the turn-on time Ton and the turn-off time Toff based on the output signals from the terminal L2 and L3 of the channel number detecting circuit 50, that is, based on the operation channel Nch, an Oscillator 76 generating the control clock CLK with the turn-on time Ton and the turn-off time Toff selected by the selecting circuit 74, and a driver 78 outputting data from the oscillator 76 the switching element.

Figure 10:
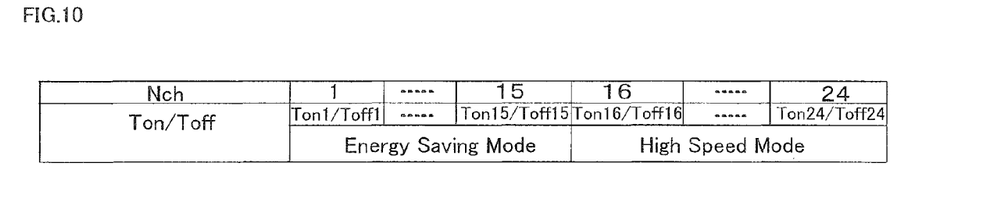
FIG. 10 schematically illustrates on-off-time setting table.

The on-off-time setting table stored in the resistor 72 is set the turn-on time Ton and turn-off time Toff of an energy saving mode that makes reduction in power consumption accompanying the switching control using the control clock signal CLK take precedence over rapid rising of the output terminal voltage Vpgm of the boost convertor 42 when the operation channel number Nch is lower than or equal to fifteen, and is set the turn-on time Ton and turn-off time Toff of a high speed mode that makes rapid rising of the output terminal voltage Vpgm of the boost convertor 42 take precedence over reduction in power consumption accompanying the switching control using the control clock signal CLK when the operation channel number Nch is higher than fifteen. FIG. 10 schematically illustrates the on-off time setting table.

The selecting circuit 74 checks any one of the output signals of the terminal L2 and L3 of the channel number detecting circuit 50, and selects the on-time Ton and the off-time Toff from resistor 72 based on the output signals of the terminal L2 and L3. The selecting circuit 74, for examples, selects the on-time Ton and the off-time Toff of the operation channel Nch that is equal to four from the resistor 72 when the signal from the terminal L2 of one detecting circuit 59 (three detecting circuit 59 supplied the reference voltage Vref3 when the operation channel number Nch increases from one to two, from one to three, or from one to three) detecting increase of the operation channel Nch from 1 to less than or equal to four is a high level signal, the signal from the terminals L2 of the other detecting circuits 59 are low level signal, and the signals from the terminals L3 of each detecting circuit 61 of the decrease side detecting circuit 60. The selecting circuit 74, for example, selects the on-time Ton and the off-time Toff of the operation channel Nch that is equal to three from the resistor 72 when all signals from terminals L2 are low level signals, the signal from the terminal L3 of one detecting circuit 61 (three detecting circuit 61 supplied the reference voltage Vref3 when the operation channel number Nch decreases from four to three, from four to two, or from four to one) detecting decrease of the operation channel Nch from four to one is a high level signal, the signal from the terminals L3 of the other detecting circuits 61 are low level signal. Thus the selecting a state of output signals from the terminals L2 and L3, that is, the on-time Ton and the off-time Toff of the control clock signal CLK based on the operation channel by the selecting circuit 74 is accomplished.

Figure 11:
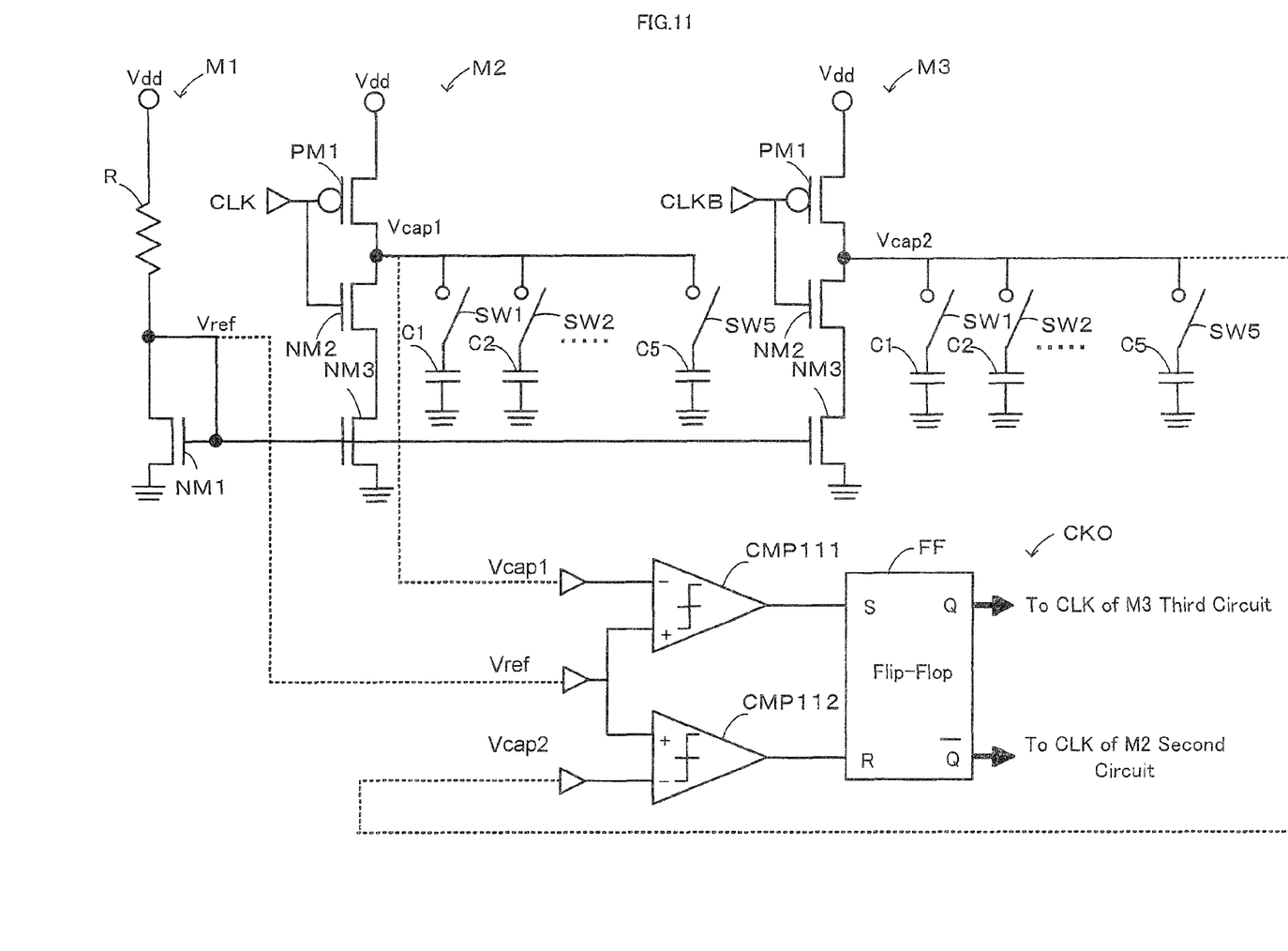
FIG. 11 schematically illustrates the circuit of an oscillator 76.

FIG. 11 schematically illustrates the circuit of an oscillator 76. As illustrated in FIG. 11, the oscillator 76 has a first circuit M1 configured as a constant current circuit, a second circuit M2 and a third circuit M3 configured to be a current mirror in conjunction with the first circuit M1, and a clock signal output circuit CKO generating and outputting the control clock signal CLK using an output of the first circuit M1, the second circuit M2 and the third circuit M3. The first circuit M1 has a resistor R and a NMOS (N-channel Metal Oxide Semiconductor) transistor NM1 having a drain supplied a power-supply voltage Vdd via the resistor R, a gate connected with the drain, and a source grounded. The second circuit M2 has a PMOS (P-channel Metal Oxide Semiconductor) transistor PM1 has a source supplied the power-supply voltage, a NMOS transistor NM2 having a gate and a drain connected with a gate and a drain of the transistor PM1 respectively, and a NMOS transistor NM3 having a gate connected with the gate of the transistor NM1 and a drain connected with the drain of the transistor NM2. The third circuit M3 is the same configuration as the second circuit M2. Capacitances C1-C5 are connected in parallel with each other between the drain of the transistor PM1 of the second circuit M2 and the third circuit M3 and a ground via the switch SW1-SW5. The clock signal output circuit CKO has a comparator CMP111 comparing a reference voltage Vref that is a voltage between the drain of the transistor NM1 and the ground to a voltage between the drain of the transistor PM1 of the second circuit M2 and the ground, that is, a capacitance voltage Vcap1 that is a voltage between electrodes of the capacitances C1-C5 and outputting a comparison result, a comparator CMP112 comparing the reference voltage Vref to a voltage between the drain of the transistor PM1 of the third circuit M3 and the ground, that is, a capacitance voltage Vcap2 that is a voltage between electrodes of capacitances C1-C5 and outputting a comparison result, and a flip-flop FF set or reset in response to the comparison results from comparators CMP111 and CMP112. The flip-flop FF is set and outputs a signal with a low level logic voltage as the control clock signal CLK when the capacitance voltage Vcap1 is equal to or higher than the reference voltage Vref. The flip-flop FF is reset and outputs a signal with a high level logic voltage as the control clock signal CLK when the capacitance voltage Vcap2 is higher than or equal to the reference voltage Vref. The flip-flop FF outputs a clock signal CLKB having an antiphase to the clock signal CLK. The oscillator DCO has a transistor (not illustrated) fixing a voltage of the control clock signal with a low level logic voltage in response to being input a stand-by signal STB from the control logic circuit 40. In the oscillator 76, the on-time Ton and the off-time Toff of the control clock signal CLK output from the oscillator 76 are decided by a resistance R of the resistor and capacitance C of capacitors connected switches of the second circuit M2 and the third circuit M3 that is turned on.

The voltage boost circuit 40 of the SSD 10 of the embodiment generates the control clock signal CLK having preliminarily set on-time and off-time, and performs the voltage boosting switching control controlling the transistor N2 of the boost converter 42. Thus the output terminal voltage Vpgm rises toward the voltage V3 in the shape of the step. Boosting the output terminal voltage Vpgm upto the voltage V2 is accomplished. The voltage boosting switching control continue until the output terminal voltage Vpgm reaches to the voltage V2 when the all signals from the terminals L2 and L3 of the channel number detecting circuit 50 are low level signal, that is, the operation channel number Nch is maintained. When the output terminal voltage Vpgm reaches to the voltage V2, an operation of the oscillator 76 is stopped in response to the input of the stand by signal STB from the target voltage detecting circuit 62 via the selecting circuit 74 of the switching control circuit 70.

Figure 12:
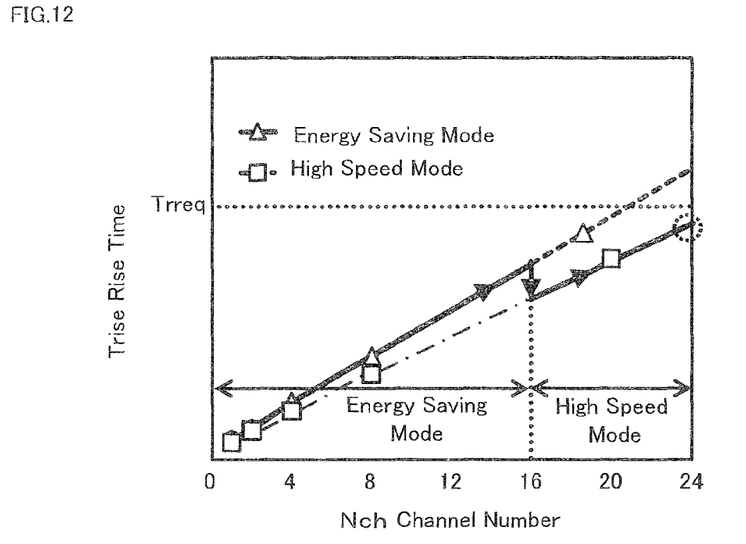
FIG. 12 schematically illustrates the number of the operation channels Nch and a rise time.
Figure 13:
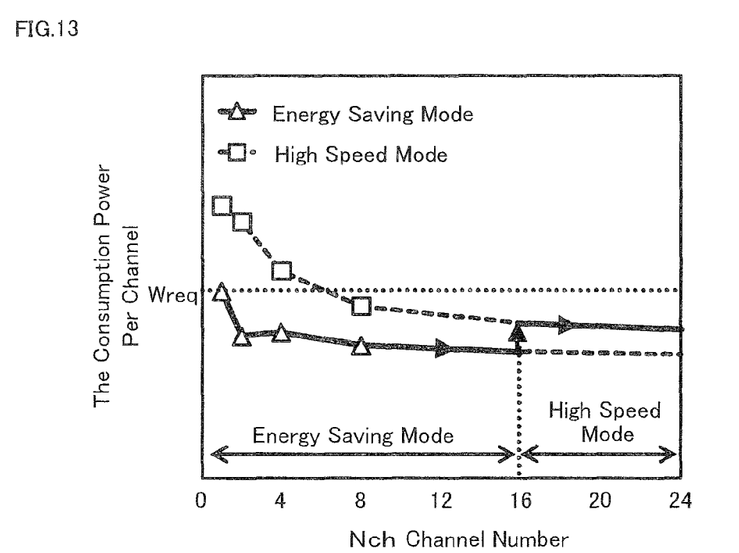
FIG. 13 schematically illustrates the number of the operation channels Nch and power consumption per channel.

When the operation channel number Nch increases or decreases during the voltage boosting switching control, the channel number detecting circuit 50 outputs an output signal showing the operation channel number Nch after increase or decrease from the terminals L2 and L3. The selecting circuit 74 of the switching circuit 70 selects the on-time Ton and the off-time Toff from the terminal L2 and L3 of the channel number detecting circuit 50 based on a state of the output signal, and the oscillator 76 outputs the control clock signal CLK having the on-time Ton and the off-time Toff selected by the selecting ciecuit 74 via the driver 78. In this embodiment, the on-time Ton and the off-time Toff are stored in the resistor 72 at the energy saving mode when the operation channel number Nch is less than or equal to fifteen, and the on-time Ton and the off-time Toff are stored in the resistor 72 at the high speed mode when the operation channel number Nch is more than fifteen. When the operation channel number Nch is less than or equal to fifteen, time for rising (rise time) of the output terminal voltage Cpgm is long and power consumption per channel is relatively low. When the operation channel number Nch is more than fifteen, rise time of the output terminal voltage Cpgm is short and power consumption per channel is relatively large. FIG. 12 schematically illustrates the number of the operation channels Nch and a rise time. FIG. 13 schematically illustrates the number of the operation channels Nch and power consumption per channel. In these figures, solid line shows the rise time and the power consumption per channel in case the transistor N2 is controlled by the control clock signal CLK having on-time Ton and off-time Toff based on the operation channel number Nch, dash line shows the rise time and the power consumption per channel in case the transistor N2 is controlled by the control clock signal CLK having on-time Ton and off-time Toff at the energy saving mode or at the high speed mode regardless of the operation channel number Nch. As shown by a diagram, this control controls the transistor N2 using the control clock signal CLK having on-time Ton and off-time Toff adjusted the operation channel number Nch. Thus boosting the output terminal voltage Vpgm up to the voltage V2 is accomplished.

A described above, the channel number detecting circuit 50 detects the operation channel number Nch based on the the output terminal voltage Vpgm after falling down when the output terminal voltage Vpgm falls down during the voltage boosting control, and the switching control circuit 70 generates the control clock signal CLK having the on-time and the off-time adjusted based on the operation channel number Nch and performs the voltage boosting control using generating control clock signal CLK. The voltage boosting control is properly performed based on the operation channel number Nch when the operation channel number Nch increase during performing the voltage boosting control. Thus boosting the power supply voltage Vdd up to the voltage V2 is accomplished. The increase side detecting circuit 58 of the voltage boosting circuit 40 detects the operation channel number Nch based on the determination reference voltage Vref2 as the operation channel number Nch when the output terminal voltage Vpgm reaches from a voltage that is more than or equal to the determination voltage Vref1 to a voltage that is lower than the determination voltage Vref2 during the voltage boosting control. This arrangement properly detects the operation channel number Nch. Thus boosting the power supply voltage Vdd up to the voltage V2 is accomplished. The channel number detecting circuit 50 generates the determination voltages Vref1 and Vref2 tending to be larger as the output terminal voltage Vgm, outputs the determination voltages Vref1 and Vref2, detects the operation channel number Nch based on the determination reference voltage. Vref2 as the operation channel number Nch when the output terminal voltage Vpgm reaches from a voltage that is more than or equal to the determination voltage Vref1 to a voltage that is lower than the determination voltage Vref2 during the voltage boosting control. This arrangement properly detects the operation channel number Nch. Thus boosting the power supply voltage Vdd up to the voltage V2 is accomplished. The increase side detecting circuit 58 has a plurality of the detecting circuits 59 supplied the determination voltage Vref1 and Vref2 in the increase pattern Pitag. This arrangement properly detects the operation channel number Nch. Thus boosting the power supply voltage Vdd up to the voltage V2 is accomplished.

The channel number detecting circuit 50 detects the operation channel number Nch based on the output terminal voltage Vpgm after rising when the output terminal voltage Vpgm exceeds the determination reference signals Vref3 within the 2 cycles time of the control clock signal CLK during the voltage boosting control. This arrangement properly detects the operation channel number Nch. Thus boosting the power supply voltage Vdd up to the voltage V2 is accomplished. The channel number detecting circuit 50 detects the operation channel number Nch as the operation channel number based on the determination voltage Vref3 when the output terminal voltage Vpgm exceeds the determination reference signals Vref1 and exceeds the determination reference signals Vref3 within the 2 cycles time of the control clock signal CLK after the output terminal voltage Vpgm exceeds the determination reference signals Vref1 during the voltage boosting control. This arrangement properly detects the operation channel number Nch. Thus boosting the power supply voltage Vdd up to the voltage V2 is accomplished. The channel number detecting circuit 50 generates the determination voltages Vref1 and Vref3 tending to be larger as the output terminal voltage Vgm, and outputs the determination voltages Vref1 and Vref3. The decrease side detecting circuit 60 detects the operation channel number Nch as the operation channel number based on the determination reference voltage Vref 3 when the output terminal voltage Vpgm exceeds the determination reference signals Vref1 and exceeds the determination reference signals Vref3 within the 2 cycles time of the control clock signal CLK after the output terminal voltage Vpgm exceeds the determination reference signals Vref1 during the voltage boosting control. This arrangement properly detects the operation channel number Nch. Thus boosting the power supply voltage Vdd up to the voltage V2 is accomplished. The decrease side detecting circuit 60 has a plurality of the detecting circuits 61 supplied the determination voltage Vref1 and Vref3 in the increase pattern Pdtag. This arrangement properly detects the operation channel number Nch. Thus boosting the power supply voltage Vdd up to the voltage V2 is accomplished.

The switching control circuit 70 generates the control clock signal CLK having the on-time and the off-time adjusted at the energy saving mode when the operation channel number Nch is lower than or equal than fifteen, and generates the control clock signal CLK having the on-time and the off-time adjusted at the high speed mode when the operation channel number Nch is more than fifteen. This arrangement makes reduction in power consumption accompanying the switching control using the control clock signal CLK take precedence over rapid rising of the output terminal voltage Vpgm of the boost convertor 42 when the operation channel number Nch is lower than or equal to fifteen, and makes rapid rising of the output terminal voltage Vpgm of the boost convertor 42 take precedence over reduction in power consumption accompanying the switching control using the control clock signal CLK when the operation channel number Nch is more than fifteen. Thus boosting the power supply voltage Vdd up to the voltage V2 is accomplished.

In the SSD 10, the reference voltage generation circuit 56 is to generate the determination reference voltage Vref1, Vref2 and Vref3 tending to be larger as the output terminal voltage Vgm. The reference voltage generation circuit 56 may be to generate the determination reference voltage Vref1, Vref2 and Vref3 tending to be larger as the output terminal voltage Vgm in the shape of steps. The reference voltage generation circuit 56 may be to generate the determination reference voltage Vref1, Vref2 and Vref3 to be maintained a predefined value regardless of the output terminal voltage Vpgm.

In the SSD 10, the increase side detecting circuit 58 is to detect the operation channel number Nch based on the determination reference voltage Vref2 as the operation channel number Nch when the output terminal voltage Vpgm reaches from a voltage that is more than or equal to the determination voltage Vref1 to a voltage that is lower than the determination voltage Vref2 during the voltage boosting control. The increase side detecting circuit 58 may be to detect the operation channel number based the output terminal voltage Vpgm after falling when the output terminal voltage falls during the voltage boosting control. The increase side detecting circuit 58 may be to, for example, compares the output terminal voltage Vpgm with the voltage V1 when the output terminal voltage falls during the voltage boosting control, and detects the operation channel of the voltage V1 when the output terminal voltage Vpgm becomes a voltage near the voltage V1.

In the SSD 10, the decrease side detecting circuit 60 is to detect circuit 60 detects the operation channel number Nch as the operation channel number of the determination reference voltage Vref3 when the output terminal voltage Vpgm exceeds the determination reference signals Vref1 and exceeds the determination reference signals Vref3 within the two cycles time of the control clock signal CLK after the output terminal voltage Vpgm exceeds the determination reference signals Vref1 during the voltage boosting control. The time when the output terminal voltage Vpgm exceeds the determination reference signals Vref1 and exceeds the determination reference signals Vref3 may be to be set properly, for example, three cycle.

In the SSD 10, the SSD10 is to have both the increase side detecting circuit 58 and decrease side detecting circuit 60 for detecting the operation channel number Nch after increase and decrease. In case the operation channel number Nch either increase or decrease, the SSD10 may be to have either the increase side detecting circuit 58 or decrease side detecting circuit 60, and to detect either the operation channel number Nch after increase or the operation channel number Nch after decrease.

In the SSD 10, the switching control circuit 70 is to generate the control clock signal CLK having the on-time and the off-time adjusted at the energy saving mode when the operation channel number Nch is lower than or equal than fifteen, and to generate the control clock signal CLK having the on-time and the off-time adjusted at the high speed mode when the operation channel number Nch is more than fifteen. In the switching control circuit 70, a threshold of the operation channel number Nch switching from the energy saving mode to the high speed mode may be to be set properly. The switching control circuit 70 maybe to generate the control clock signal CLK having the on-time and the off-time adjusted at the energy saving mode regardless of the operation channel number Nch, to generate the control clock signal CLK having the on-time and the off-time adjusted at the high speed mode regardless of the operation channel number Nch, or to generate the control clock signal CLK having the on-time and the off-time adjusted at a mode different from the energy saving mode and the high speed mode.

Figure 14:
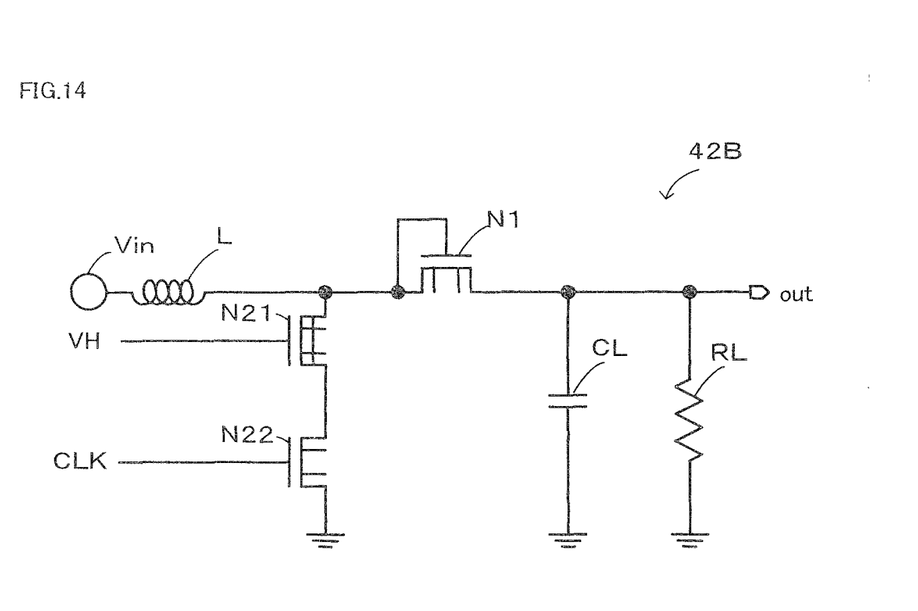
FIG. 14 schematically illustrates the configuration of a boost convertor 42B of another modified structure.

In the SSD 10, the boost converters 42 is to have the transistor N2 connected in parallel with the output terminal Vout between the inductor L and the transistor Ni from a side of the inductor L. The requirement is that the boost converters 42 has the switching element connected in parallel with the output terminal Vout between the inductor L and the transistor N1 from a side of the inductor L. FIG. 14 schematically illustrates the configuration of a boost convertor 42B of another modified structure. The boost converters 42B may be to have, in place of the depletion-type NMOS transistor N2, a depletion-type NMOS transistor N21 (described below as a transistor N21) connected between the inductor L and the transistor N1 from a side of the inductor L and a enhancement-type NMOS transistor N23 (described below as a transistor N22) connected in series with the transistor N21. In this case, a gate voltage of the transistor N21 may be to be maintained to a predefined voltage Vm, and the control clock signal CLK may be to be input to a gate of the transistor N22. The predefined voltage VH is to be desirably the voltage between the voltage V1 and the voltage V2 (for example, 3.6V). The boost converters 42 has an enhancement-type NMOS transistor N1 having a gate, a source connected with the gate and connected with the inductor L and a drain connected with the output terminal Vout. The requirement is that the boost converters 42 has a rectifying element connected in series between the inductor L and the output terminal Vout and rectifies current to an direction from the input terminal Vin to the output terminal Vout. The boost converters 42 and 142 may be to have a diode in place of the transistor N1.

In the SSD10, the interposer 30 is disposed on an upper surface of the flash memory chip 22. The interposer 30 may be to be disposed on a lower surface. The other integrate circuit or interposer may be to be stacked on the interposer 30.

In the embodiment described above, the SSD10 is to have the flash memory chip 22 having flash memory and not restrictive. The SSD10 may be to have integrated circuit chip having integrated circuit operated at a predefined voltage.

In the embodiment described above, the embodiment is to be adapted to the SSD10. The embodiment may be to be used for the integrated circuit device having a plurality of integrated circuit chips including an integrated circuit operated at a specified voltage, and an interposer including a voltage boosting supply circuit that boosts a power-supply voltage supplied from a power supply to the specified voltage and supplies the boosting voltage to the integrated circuit of the integrated circuit chips and a chip control circuit that selects at least one of the plurality of integrated circuit chips and controls the integrated circuit so that the selecting integrated circuit chip is operated using the supplied voltage from the voltage boosting supply circuit. The integrated circuit device may be to be used for a micro computer.

The embodiment discussed above is to be considered in all aspects as illustrative and no restrictive. There may be many modifications, changes, and alternative without departing from the scope or spirit of the main characteristics of the present invention. The scope and spirit of the present invention are indicated by the appended claims, rather than by the foregoing description.

The technique of the present invention is preferably applied to the manufacturing industries of integrated circuit device.

The invention is an accomplishment of project of Strategic creative research promotion business of incorporated administrative agency Japan Science and Technology Agency in the 21 year of the Heisei era, "Dependable wireless solid-state-drive".

The disclosure of Japanese Patent Application No.2010-117652 filed May 21, 2010 including specification, drawings and claims is incorporated herein by reference in its entirety.

What is claimed is:

1. An integrated circuit device comprising:
a plurality of integrated circuit chips having an integrated circuit operated at a specified voltage level; and
an interposer,
wherein the interposer comprises:
a voltage boosting supply circuit that boosts a power-supply voltage supplied from a power supply to the specified voltage level and supplies a voltage to the integrated circuit of the integrated circuit chips; and
a chip control circuit that selects at least one of the plurality of integrated circuit chips and controls the integrated circuit so that the selecting integrated circuit chip is operated using the voltage supplied from the voltage boosting supply circuit,
the chip control circuit changes number of the selecting integrated circuit chips based on a specified control signal, and
the voltage boosting supply circuit comprises:
a boost converter having a inductor connected in series between an input terminal supplied with the power supply voltage and an output terminal supplying a voltage to the integrated circuit of the integrated circuit chip, a rectifying element connected in series between the inductor and the output terminal and rectifying current to a direction from the input terminal to the output terminal, and a switching element connected between the inductor and the rectifying element in parallel with the output terminal as viewed from the inductor;
a number-of-chip detecting circuit detecting number of operating integrated circuit chips that is number of the integrated circuit chips operating at the voltage supplied from the voltage boosting supply circuit based on a voltage of the output terminal of the boost converter after reduction when the voltage of the output terminal of the boost converter is reduced during being performed a voltage boosting switching control that controls the switching element so that the output terminal voltage reaches the specified voltage level; and
a switching control circuit generating a control clock signal having turn-on time and turn-off time adjusted based on the detected number of operating integrated circuit chips and performing the voltage boosting switching control using the generated control clock signal.

2. The integrated circuit device in accordance with claim 1, wherein the chip control circuit changes the number of selecting integrated circuit chips from a first number of chips to a second number of chips based on the specified control signal, the second number being greater than the first number, and
the number-of-chip detecting circuit of the voltage boosting supply circuit detects the number of the operation chips as the second number of chips when the voltage of the output terminal varies from a voltage higher than or equal to a first determination reference voltage to a voltage lower than a second determination reference voltage during performing of the voltage boosting switching control, the second determination reference voltage being lower than the first determination reference and a voltage for determining whether the number of the operation chips varies from the first number of chips to the second number of chips or not.

3. The integrated circuit device in accordance with claim 2, wherein the number-of-chip detecting circuit of the voltage boosting supply circuit comprises:
an increase side reference voltage generation-output circuit generating and outputting the first determination reference voltage and the second determination reference voltage, the first determination reference voltage and the second determination reference voltage tending to be higher as the output terminal voltage becomes higher; and
an increase side detecting circuit detecting the number of the operation chips as the second number of chips when the voltage of the output terminal varies from a voltage higher than or equal to the first determination reference voltage to a voltage lower than the second determination reference voltage during performing of the voltage boosting switching control.

4. The integrated circuit device in accordance with claim 2, wherein the chip control circuit changes the number of selecting integrated circuit chips from the first number of chips to the second number of chips or from the first number of chips to a third number of chips that is greater than the second number of chips based on the specified control signal, and
the number-of-chip detecting circuit of the voltage boosting supply circuit detects the number of the operation chips as the second number of chips when the voltage of the output terminal varies from a voltage higher than or equal to the first determination reference voltage to a voltage lower than the second determination reference voltage and higher than or equal to the third determination reference voltage during performing of the voltage boosting switching control, and detects the number of the operation chips as the third number of chips when the voltage of the output terminal varies from a voltage being higher than or equal to the first determination reference voltage to a voltage being lower than the third second determination reference voltage during performing of the voltage boosting switching control.

5. The integrated circuit device in accordance with claim 1, wherein the number-of-chip detecting circuit of the voltage boosting supply circuit detects the number of the operation chips based on a voltage after increase when the voltage of the output terminal increases to be a voltage higher than or equal to a second specified voltage level within a specified period during performing of the voltage boosting switching control.

6. The integrated circuit device in accordance with claim 5, wherein the chip control circuit changes the number of selecting integrated circuit chips from a fourth number of chips to a fifth number of chips that is greater than the fourth number of chips based on the specified control signal, and
the number-of-chip detecting circuit of the voltage boosting supply circuit detects the number of the operation chips as the fifth number of chips when the voltage of the output terminal reaches to a voltage higher than or equal to the third determination reference voltage and exceeds a fourth determination reference voltage within the specified time after the voltage of the output terminal becomes higher than or equal to the third determination reference voltage during performing of the voltage boosting switch control, the fourth determination reference voltage being a voltage for determining a condition that the number of the operation chips is changed from the fourth number of the chips to the fifth number of chips and being higher than the third determination reference voltage.

7. The integrated circuit device in accordance with claim 6, wherein the number-of-chip detecting circuit of the voltage boosting supply circuit comprises:
a decrease side reference voltage generation-output circuit generating and outputting the third determination reference voltage and the fourth determination reference voltage, the third determination reference voltage and the fourth determination reference voltage tending to be higher as the output terminal voltage becomes higher; and
a decrease side detecting circuit detecting the number of the operation chips as the fifth number of chips when the voltage of the output terminal reaches to a voltage higher than or equal to the third determination reference voltage and exceeds the fourth determination reference voltage within the specified time after the voltage of the output terminal becomes higher than or equal to the third determination reference voltage during performing of the voltage boosting switch control.

8. The integrated circuit device in accordance with claim 6, wherein the chip control circuit changes the number of selecting integrated circuit chips from the forth number of chips to the fifth number of the chips or from the forth number of chips to a sixth number of the chips that is less than the fifth number of chips based on the specified control signal, and
the number-of-chip detecting circuit of the voltage boosting supply circuit detects the number of the operation chips as the fifth number of chips when the voltage of the output terminal reaches to a voltage higher than or equal to the third determination reference voltage and the voltage of the output terminal becomes lower than or equal to a fifth determination reference voltage within a second specified time after the voltage of the output terminal becomes higher than or equal to the third determination reference voltage during performing of the voltage boosting switch control, and detects the number of the operation chips as the sixth number of chips when the voltage of the output terminal reaches to a voltage higher than or equal to the third determination reference voltage and the voltage of the output terminal becomes higher than the fifth determination reference voltage within a third specified time after the voltage of the output terminal becomes higher than or equal to the third determination reference voltage during performing of the voltage boosting switch control, the fifth determination reference voltage being higher than the fourth determination reference voltage.

9. The integrated circuit device in accordance with claim wherein the integrated circuit is a flash memory.

10. The integrated circuit device in accordance with claim 1, wherein the switch control circuit generates the control clock signal having turn-on time and turn-off time adjusted in a manner that makes reduction in power consumption accompanying the voltage boosting switching control take precedence over rapid rising of the output terminal voltage when the detected number of the operation chips is lower than or equal to a specified number, and generates the control clock signal having turn-on time and turn-off time adjusted in a manner that makes the rapid rising of the output terminal voltage take precedence over the reduction in power consumption accompanying the voltage boosting switching control when the detected number of the operation chips is higher than the specified number.

11. An integrated circuit device comprising:
a plurality of integrated circuit chips having an integrated circuit operated at a specified voltage level; and
an interposer,
wherein the interposer comprises;
a voltage boosting supply circuit that boosts a power-supply voltage supplied from a power supply to the specified voltage level and supplies a voltage to the integrated circuit of the integrated circuit chips; and
a chip control circuit that selects at least one of the plurality of integrated circuit chips and controls the integrated circuit so that the selecting integrated circuit chip is operated using the voltage supplied from the voltage boosting supply circuit,
the chip control circuit changes number of the selecting integrated circuit chips based on a specified control signal, and
the voltage boosting supply circuit comprises:
a boost converter having a inductor connected in series between an input terminal supplied with the power supply voltage and an output terminal supplying a voltage to the integrated circuit of the integrated circuit chip, a rectifying element connected in series between the inductor and the output terminal and rectifying current to a direction from the input terminal to the output terminal, and a switching element connected between the inductor and the rectifying element in parallel with the output terminal as viewed from the inductor;
a number-of-chip detecting circuit detecting number of operating integrated circuit chips that is number of the integrated circuit chips operating at the voltage supplied from the voltage boosting supply circuit based on a voltage of the output terminal of the boost converter after rising when an output terminal voltage that is the voltage of the output terminal of the boost converter rises during being performed a voltage boosting switching control controlling the switching element so that the output terminal voltage reaches the specified voltage level; and
a switching control circuit generating a control clock signal having turn-on time and turn-off time adjusted based on the detected number of operating integrated circuit chips and performing the voltage boosting switching control using the generated control clock signal.

12. The integrated circuit device in accordance with claim 11,
wherein the switch control circuit generates the control clock signal having turn-on time and turn-off time adjusted in a manner that makes reduction in power consumption accompanying the voltage boosting switching control take precedence over rapid rising of the output terminal voltage when the detected number of the operation chips is lower than or equal to a specified number, and generates the control clock signal having turn-on time and turn-off time adjusted in a manner that makes the rapid rising of the output terminal voltage take precedence over the reduction in power consumption accompanying the voltage boosting switching control when the detected number of the operation chips is higher than the specified number.

13. The integrated circuit device in accordance with claim 11,
wherein the integrated circuit is a flash memory.

* * * * *